United States Patent
Khlat et al.

(10) Patent No.: US 7,877,060 B1
(45) Date of Patent: Jan. 25, 2011

(54) FAST CALIBRATION OF AM/PM PRE-DISTORTION

(75) Inventors: Nadim Khlat, Cugnaux (FR); Wael A. Al-Qaq, Oak Ridge, NC (US); Dennis Mahoney, High Point, NC (US); Paul D. Brey, Chapel Hill, NC (US); Brian Baxter, High Point, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 1165 days.

(21) Appl. No.: 11/347,957

(22) Filed: Feb. 6, 2006

(51) Int. Cl.
*H04B 1/00* (2006.01)

(52) U.S. Cl. ........... 455/63.1; 455/295; 455/67.11; 455/302; 455/232.1; 375/297; 375/300; 331/302

(58) Field of Classification Search ......... 455/63.1, 455/67.11, 114.2, 114.3, 295, 302, 69, 67.16, 455/67.14, 67.13; 375/295, 296, 297, 329; 330/149, 136
See application file for complete search history.

(56) References Cited

U.S. PATENT DOCUMENTS

| | | | |
|---|---|---|---|
| 3,900,823 A | 8/1975 | Sokal et al. | |
| 4,389,618 A * | 6/1983 | Bauman | 330/149 |
| 4,609,881 A | 9/1986 | Wells | |
| 4,837,786 A | 6/1989 | Gurantz et al. | |
| 4,968,908 A * | 11/1990 | Walls | 327/238 |
| 5,055,802 A | 10/1991 | Hietala et al. | |
| 5,079,522 A | 1/1992 | Owen et al. | |
| 5,313,411 A | 5/1994 | Tsujimoto | |
| 5,430,416 A | 7/1995 | Black et al. | |
| 5,444,415 A | 8/1995 | Dent et al. | |
| 5,524,286 A | 6/1996 | Chiesa et al. | |
| 5,598,436 A | 1/1997 | Brajal et al. | |
| 5,608,353 A | 3/1997 | Pratt | |
| 5,617,450 A | 4/1997 | Kakuishi et al. | |
| 5,629,648 A | 5/1997 | Pratt | |
| 5,822,011 A | 10/1998 | Rumreich | |
| 5,900,778 A | 5/1999 | Stonick et al. | |
| 5,952,895 A | 9/1999 | McCune, Jr. et al. | |
| 6,008,703 A | 12/1999 | Perrott et al. | |

(Continued)

OTHER PUBLICATIONS

Andraka, Ray, "A Survey of CORDIC Algorithms for FPGA Based Computers," Association for Computing Machinery, 0-89791-978-5, 1998.

(Continued)

*Primary Examiner*—Edward Urban
*Assistant Examiner*—Ganiyu Hanidu
(74) *Attorney, Agent, or Firm*—Withrow & Terranova, P.L.L.C.

(57) ABSTRACT

A system and method are provided for calibrating Amplitude Modulation to Phase Modulation (AM/PM) pre-distortion in a transmitter operating according to a polar modulation scheme. In general, phase modulation is disabled during transmission of an actual polar modulation signal. As a result, the transmitter provides a radio frequency (RF) output signal having an amplitude modulation component and ideally a constant phase. However, the AM/PM distortion of the transmitter creates a phase modulation component in the RF output signal. The phase component of the RF output signal, which is the AM/PM distortion of the transmitter, is measured by test equipment. The AM/PM pre-distortion applied by the transmitter is then calibrated based on the measured AM/PM distortion such that the AM/PM distortion of the transmitter is substantially reduced.

26 Claims, 5 Drawing Sheets

U.S. PATENT DOCUMENTS

| | | | |
|---|---|---|---|
| 6,101,224 A | 8/2000 | Lindoff et al. | |
| 6,115,684 A | 9/2000 | Kawahara et al. | |
| 6,130,579 A | 10/2000 | Iyer et al. | |
| 6,141,390 A | 10/2000 | Cova | |
| 6,191,656 B1 | 2/2001 | Nadler | |
| 6,211,747 B1 | 4/2001 | Trichet et al. | |
| 6,229,395 B1 | 5/2001 | Kay | |
| 6,236,687 B1 | 5/2001 | Caso et al. | |
| 6,236,703 B1 | 5/2001 | Riley | |
| 6,236,837 B1 | 5/2001 | Midya | |
| 6,240,278 B1 | 5/2001 | Midya et al. | |
| 6,246,286 B1 | 6/2001 | Persson | |
| 6,271,727 B1 | 8/2001 | Schmukler | |
| 6,275,685 B1 | 8/2001 | Wessel et al. | |
| 6,285,239 B1 | 9/2001 | Iyer et al. | |
| 6,288,610 B1 | 9/2001 | Miyashita | |
| 6,295,442 B1 | 9/2001 | Camp, Jr. et al. | |
| RE37,407 E * | 10/2001 | Eisenberg et al. | 330/2 |
| 6,307,364 B1 | 10/2001 | Augustine | |
| 6,329,809 B1 | 12/2001 | Dening et al. | |
| 6,335,767 B1 | 1/2002 | Twitchell et al. | |
| 6,356,150 B1 | 3/2002 | Spears et al. | |
| 6,359,950 B2 | 3/2002 | Gossmann et al. | |
| 6,366,177 B1 * | 4/2002 | McCune et al. | 332/103 |
| 6,377,784 B2 * | 4/2002 | McCune | 455/108 |
| 6,392,487 B1 | 5/2002 | Alexanian | |
| 6,417,731 B1 | 7/2002 | Funada et al. | |
| 6,462,617 B1 | 10/2002 | Kim | |
| 6,489,846 B2 | 12/2002 | Hatsugai | |
| 6,504,885 B1 | 1/2003 | Chen | |
| 6,522,121 B2 | 2/2003 | Coumou | |
| 6,581,082 B1 | 6/2003 | Opsahl | |
| 6,587,514 B1 | 7/2003 | Wright et al. | |
| 6,642,786 B1 | 11/2003 | Jin et al. | |
| 6,693,468 B2 | 2/2004 | Humphreys et al. | |
| 6,700,929 B1 | 3/2004 | Shan et al. | |
| 6,701,134 B1 | 3/2004 | Epperson | |
| 6,701,138 B2 | 3/2004 | Epperson et al. | |
| 6,720,831 B2 | 4/2004 | Dening et al. | |
| 6,724,252 B2 | 4/2004 | Ngo et al. | |
| 6,724,265 B2 | 4/2004 | Humphreys | |
| 6,724,831 B1 | 4/2004 | Hasegawa et al. | |
| 6,728,324 B1 | 4/2004 | Shan et al. | |
| 6,731,145 B1 | 5/2004 | Humphreys et al. | |
| 6,735,419 B2 | 5/2004 | Mitzlaff | |
| 6,748,204 B1 | 6/2004 | Razavi et al. | |
| 6,782,244 B2 | 8/2004 | Steel et al. | |
| 6,798,843 B1 | 9/2004 | Wright et al. | |
| 6,801,086 B1 | 10/2004 | Chandrasekaran | |
| 6,807,406 B1 | 10/2004 | Razavi et al. | |
| 6,816,718 B2 | 11/2004 | Yan et al. | |
| 6,819,914 B2 | 11/2004 | Yan et al. | |
| 6,819,941 B2 | 11/2004 | Dening et al. | |
| 6,831,506 B1 | 12/2004 | Moffat et al. | |
| 6,834,084 B2 | 12/2004 | Hietala | |
| 6,836,517 B2 | 12/2004 | Nagatani et al. | |
| 6,900,778 B1 | 5/2005 | Yamamoto | |
| 6,901,039 B1 | 5/2005 | Sugie et al. | |
| 6,901,514 B1 | 5/2005 | Iu et al. | |
| 6,903,604 B2 | 6/2005 | Kim | |
| 6,914,943 B2 | 7/2005 | Shimizu | |
| 6,975,688 B2 | 12/2005 | Rexberg et al. | |
| H002143 H | 2/2006 | Prockup | |
| 7,010,276 B2 * | 3/2006 | Sander et al. | 455/108 |
| 7,010,280 B1 | 3/2006 | Wilson | |
| 7,012,969 B2 | 3/2006 | Ode et al. | |
| 7,054,385 B2 | 5/2006 | Booth et al. | |
| 7,109,791 B1 | 9/2006 | Epperson et al. | |
| 7,113,036 B2 | 9/2006 | Moffatt et al. | |
| 7,113,551 B2 | 9/2006 | Sills et al. | |
| 7,158,494 B2 * | 1/2007 | Sander et al. | 370/329 |
| 7,349,490 B2 | 3/2008 | Hunton | |
| 7,457,586 B1 * | 11/2008 | Hietala et al. | 455/63.1 |
| 7,529,523 B1 | 5/2009 | Young et al. | |
| 7,542,520 B1 | 6/2009 | Estrada | |
| 7,593,698 B1 | 9/2009 | Johnson et al. | |
| 2001/0022532 A1 | 9/2001 | Dolman | |
| 2001/0033238 A1 | 10/2001 | Velazquez | |
| 2002/0008578 A1 | 1/2002 | Wright et al. | |
| 2002/0021764 A1 | 2/2002 | Posti | |
| 2002/0041210 A1 * | 4/2002 | Booth et al. | 330/149 |
| 2002/0044014 A1 | 4/2002 | Wright et al. | |
| 2002/0060606 A1 | 5/2002 | Andre | |
| 2002/0093378 A1 | 7/2002 | Nielsen et al. | |
| 2002/0113905 A1 | 8/2002 | Lee | |
| 2002/0160821 A1 | 10/2002 | Kaikati et al. | |
| 2002/0167923 A1 | 11/2002 | Sendonaris et al. | |
| 2003/0012289 A1 | 1/2003 | Lindoff | |
| 2003/0020538 A1 | 1/2003 | Kim | |
| 2003/0087617 A1 * | 5/2003 | Shohara | 455/192.2 |
| 2003/0133518 A1 | 7/2003 | Koomullil et al. | |
| 2003/0161487 A1 | 8/2003 | Husted et al. | |
| 2003/0179830 A1 | 9/2003 | Eidson et al. | |
| 2003/0197558 A1 | 10/2003 | Bauder et al. | |
| 2003/0197559 A1 | 10/2003 | Ghannouchi et al. | |
| 2003/0215025 A1 | 11/2003 | Hietala | |
| 2003/0215026 A1 | 11/2003 | Hietala | |
| 2003/0227342 A1 | 12/2003 | Liu | |
| 2004/0072597 A1 | 4/2004 | Epperson et al. | |
| 2004/0121741 A1 | 6/2004 | Rashev et al. | |
| 2004/0131129 A1 | 7/2004 | Harron et al. | |
| 2004/0183511 A1 | 9/2004 | Dening | |
| 2004/0198414 A1 | 10/2004 | Hunton | |
| 2004/0208157 A1 | 10/2004 | Sander et al. | |
| 2005/0002470 A1 | 1/2005 | Saed et al. | |
| 2005/0018765 A1 | 1/2005 | Endres et al. | |
| 2005/0195919 A1 | 9/2005 | Cova | |
| 2006/0071711 A1 * | 4/2006 | Persson et al. | 330/149 |
| 2006/0178120 A1 | 8/2006 | Puma | |
| 2006/0203899 A1 | 9/2006 | Gee | |
| 2006/0280502 A1 | 12/2006 | Sekine et al. | |
| 2007/0110199 A1 | 5/2007 | Momtaz et al. | |
| 2007/0190952 A1 | 8/2007 | Waheed et al. | |
| 2008/0219332 A1 | 9/2008 | Brehler | |
| 2008/0310617 A1 | 12/2008 | Daecke et al. | |
| 2009/0252255 A1 | 10/2009 | Lee et al. | |

OTHER PUBLICATIONS

Johnson, Jackie, "Power Amplifier Design for Open Loop Edge Large Signal Polar Modulation Systems," RFDesign, Jun. 2006, pp. 42-50.

Pinto et al., "Phase Distortion and Error Vector Magnitude for 8-PSK Systems," London Communications Symposium, Sep. 14-15, 2000, University College London, London, England.

Volder, Jack E., "The CORDIC Trigonometric Computing Technique," IRE Trans. On Elect. Computers p. 330, Sep. 1959.

Cusinato, Paolo, "Gain/Bandwidth Programmable PA Control Loop for GSM/GPRS Quad-Band Cellular Handsets," IEEE Journal of Solid-State Circuits, Jun. 2004, 960-966, vol. 39, No. 6, IEEE.

Notice of Allowance from U.S. Appl. No. 10/139,560 mailed Sep. 23, 2004.

Non-Final Rejection from U.S. Appl. No. 10/139,560 mailed Jul. 9, 2003.

Final Rejection from U.S. Appl. No. 10/147,569 mailed Feb. 2, 2010.

Non-Final Rejection from U.S. Appl. No. 10/147,569 mailed May 12, 2009.

Final Rejection from U.S. Appl. No. 10/147,569 mailed Sep. 4, 2008.

Non-Final Rejection from U.S. Appl. No. 10/147,569 mailed Feb. 21, 2008.

Final Rejection from U.S. Appl. No. 10/147,569 mailed Mar. 8, 2006.

Non-Final Rejection from U.S. Appl. No. 10/147,569 mailed Sep. 20, 2005.

Final Rejection from U.S. Appl. No. 10/147,579 mailed Feb. 2, 2010.

Non-Final Rejection from U.S. Appl. No. 10/147,579 mailed Aug. 17, 2009.
Final Rejection from U.S. Appl. No. 10/147,579 mailed Apr. 1, 2009.
Non-Final Rejection from U.S. Appl. No. 10/147,579 mailed Oct. 1, 2008.
Final Rejection from U.S. Appl. No. 10/147,579 mailed Apr. 29, 2008.
Non-Final Rejection from U.S. Appl. No. 10/1147,579 mailed Oct. 30, 2007.
Final Rejection from U.S. Appl. No. 10/147,579 mailed May 17, 2007.
Non-Final Rejection from U.S. Appl. No. 10/147,579 mailed Dec. 29, 2006.
Final Rejection from U.S. Appl. No. 10/147,579 mailed Mar. 16, 2006.
Non-Final Rejection from U.S. Appl. No. 10/147,579 mailed Sep. 20, 2005.
Non-Final Rejection from U.S. Appl. No. 10/874,509 mailed Aug. 4, 2008.
Non-Final Rejection from U.S. Appl. No. 10/874,509 mailed Oct. 17, 2007.
Non-Final Rejection from U.S. Appl. No. 11/874,044 mailed Dec. 24, 2008.
Non-Final Rejection from U.S. Appl. No. 11/847,044 mailed Apr. 16, 2008.
Notice of Allowance from U.S. Appl. No. 10/859,718 mailed Jun. 14, 2007.
Notice of Allowance from U.S. Appl. No. 11/209,435 mailed Dec. 9, 2008.
Examiner's Answer to Appeal Brief from U.S. Appl. No. 11/151,022 mailed Dec. 12, 2008.
Final Rejection from U.S. Appl. No. 11/151,022 mailed Apr. 15, 2008.
Non-Final Rejection from U.S. Appl. No. 11/151,022 mailed Oct. 3, 2007.
Final Rejection from U.S. Appl. No. 11/195,379 mailed Jan. 26, 2009.
Non-Final Rejection from U.S. Appl. No. 11/195,379 mailed Jul. 21, 2008.
Notice of Allowance from U.S. Appl. No. 11/392,053 mailed May 26, 2009.
Non-Final Rejection from U.S. Appl. No. 11/392,053 mailed Nov. 28, 2008.
Notice of Allowance from U.S. Appl. No. 11/548,876 mailed Nov. 16, 2009.
Non-Final Rejection from U.S. Appl. No. 11/548,876 mailed Mar. 31, 2009.
Non-Final Rejection from U.S. Appl. No. 11/736,131 mailed Apr. 1, 2010.
Non-Final Rejection from U.S. Appl. No. 11/736,176 mailed Sep. 29, 2010.

* cited by examiner

FAST CALIBRATION OF AM/PM PRE-DISTORTION

FIELD OF THE INVENTION

The present invention relates to compensating Amplitude Modulation to Phase Modulation (AM/PM) distortion in a transmitter operating according to a polar modulation scheme.

BACKGROUND OF THE INVENTION

Transmitters form one half of most communication circuits. As such, they assume a position of prominence in design concerns. With the proliferation of mobile terminals, transmitter design has progressed in leaps and bounds as designers try to minimize components and reduce size, battery consumption, and the like. Likewise, modulation schemes are continuously updated to reflect new approaches to maximize information transfers in limited bandwidths. Changes in standards or standards based on newly available spectra may also cause designers to approach modulating transmitters with different techniques.

Many different standards and modulation schemes exist, but one of the most prevalently used in the world of mobile terminals is the Global System for Mobile Communications (GSM). One of the modulation schemes of the GSM standard is the Enhanced Data Rates for GSM Evolution (EDGE) modulation scheme. The EDGE modulation scheme contains an amplitude modulation component and a phase modulation component. Since there is an amplitude modulation component, the power amplifier of a transmitter operating according to the EDGE modulation scheme must be linear or driven according to a polar modulation scheme.

If a polar modulation scheme is used, a phase modulated signal at the desired radio frequency is provided to the input of the power amplifier and an amplitude modulation component is used to vary the supply voltage provided to the power amplifier. As a result, the power amplifier may operate in saturation and efficiency is greatly improved. Unfortunately, the amplitude modulation component that controls the supply voltage provided to the power amplifier causes unwanted phase components to be created in the output of the power amplifier due to the non-linearities of the power amplifier. This is sometimes called Amplitude Modulation to Phase Modulation (AM/PM) distortion, and it degrades the spectral purity of the system and the Error Vector Magnitude.

In order to compensate for the AM/PM distortion, polar modulation systems may pre-distort the phase modulation component provided to the power amplifier such that the AM/PM distortion at the output of the power amplifier is substantially reduced. As an example, see commonly owned and assigned U.S. Patent Application Publication No. 2003/0215025, entitled AM TO PM CORRECTION SYSTEM FOR POLAR MODULATOR, filed May 16, 2002, which is hereby incorporated by reference in its entirety.

One issue with the AM/PM pre-distortion, or compensation, is that the AM/PM distortion is frequency dependent. As such, circuitry providing the AM/PM pre-distortion must be calibrated for each desired frequency band and preferably each of a number of sub-bands within each of the desired frequency bands in order to effectively reduce the AM/PM distortion. Further, due to variations in the manufacturing process causing variations in the AM/PM distortion between like transmitters, it is desirable to calibrate the AM/PM pre-distortion for each transmitter. Due to the desire to calibrate each transmitter and the number of calibrations desired for each transmitter, there remains a need for accurately and quickly calibrating AM/PM pre-distortion in a transmitter operating according to a polar modulation scheme.

SUMMARY OF THE INVENTION

The present invention provides a system and method for calibrating Amplitude Modulation to Phase Modulation (AM/PM) pre-distortion in a transmitter operating according to a polar modulation scheme. In general, phase modulation is disabled during transmission of an actual polar modulation signal. As a result, the transmitter provides a radio frequency (RF) output signal having an amplitude modulation component and, ideally, a constant phase. However, the AM/PM distortion of the transmitter creates a phase modulation component in the RF output signal. The phase component of the RF output signal, which is the AM/PM distortion of the transmitter, is measured by test equipment. The AM/PM pre-distortion applied by the transmitter is then calibrated based on the measured AM/PM distortion such that the AM/PM distortion of the transmitter is substantially reduced.

In one embodiment, it is desirable to calibrate the AM/PM pre-distortion for a number of power control levels for each of a number of desired frequency band and sub-band combinations. The number of power control levels define, at least in part, a desired dynamic range of a power amplifier of the transmitter. In order to reduce the number of calibrations needed to cover the desired dynamic range of the power amplifier, the dynamic range of the amplitude modulation component may be increased by, for example, increasing an offset and gain of the amplitude modulation component. For example, an amplitude modulation component generated according to the Enhanced Data Rates for GSM Evolution (EDGE) modulation scheme of the Global System for Mobile'Communications (GSM) standard has a 17 dB dynamic range. However, for EDGE operation, the total dynamic range for the power amplifier may be, for example 44 dB (30 dB of dynamic range for the power control levels and 14 dB of RMS to minimum). Thus, three calibrations may be required to cover the desired 44 dB range (44 dB/17 dB=2.6). However, by increasing the dynamic range of the amplitude modulation component from, for example, 17 dB to 25 dB, the desired dynamic range of the power amplifier may be covered with only two calibrations.

A frequency error may exist between the transmitter and the test equipment. In one embodiment of the present invention, this frequency error is estimated and removed from the measured phase component of the RF output signal. More specifically, known data for a transmit burst is provided to the transmitter such that the amplitude modulation component has minimal variation during two segments of the transmit burst. As such, the AM/PM distortion during the two segments of the transmit burst is minimal. The phase of the RF output signal is averaged over a first of the two segments to provide a first average phase value and over a second of the two segments to provide a second average phase value. A difference of the two average phase values is determined and divided by a known time between a first point during the first segment of the transmit burst and a second point in the second segment of the transmit burst to provide an estimate of the frequency error. The estimate of the frequency error may then be subtracted from the measured phase component of the RF output signal to provide measurements of the AM/PM distortion of the transmitter.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 2:
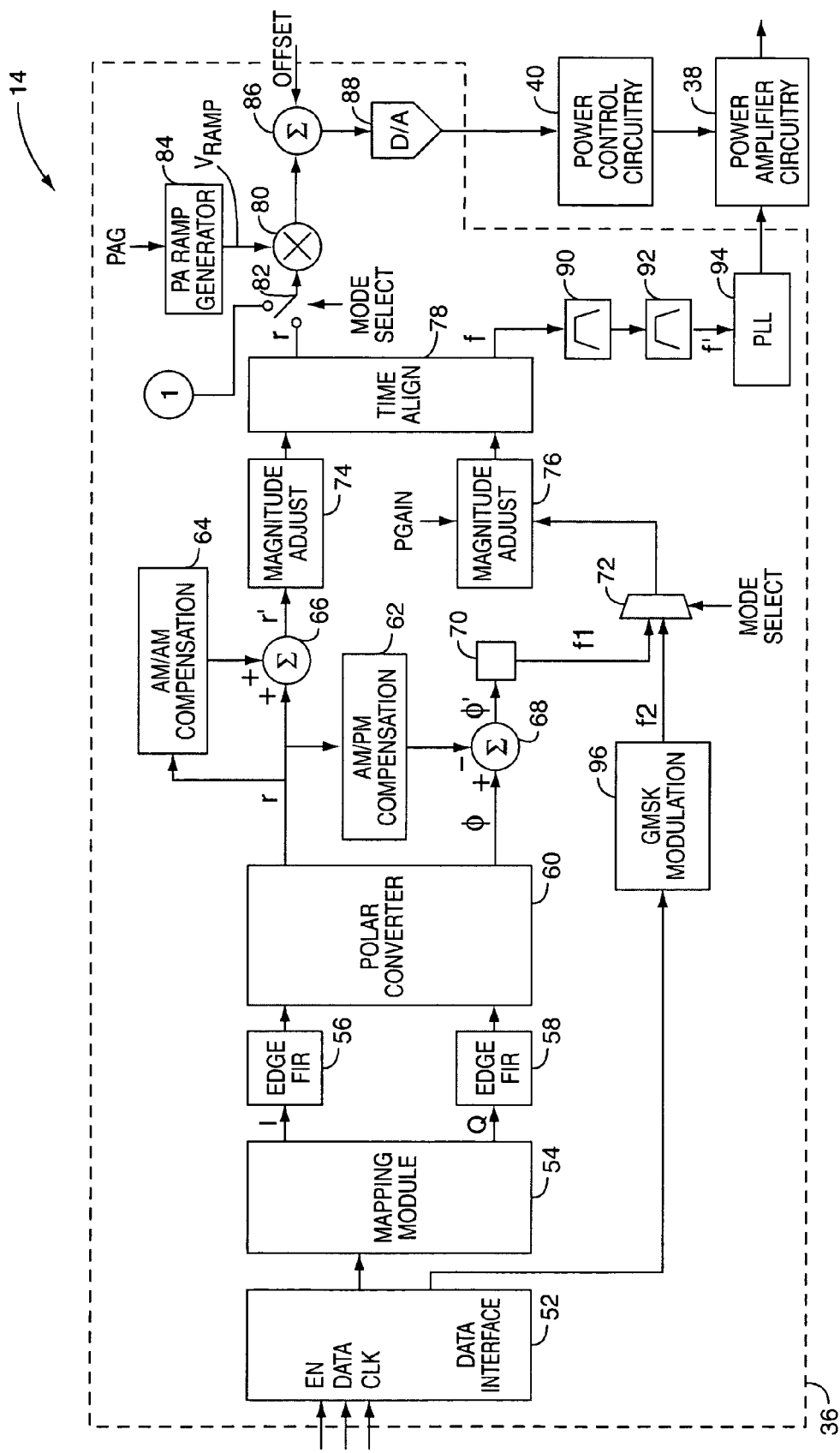
FIG. 2 is a more detailed illustration of the radio frequency transmitter section operating according to a polar modulation scheme and providing Amplitude Modulation to Phase Modulation (AM/PM) pre-distortion according to one embodiment of the present invention.
Figure 4:
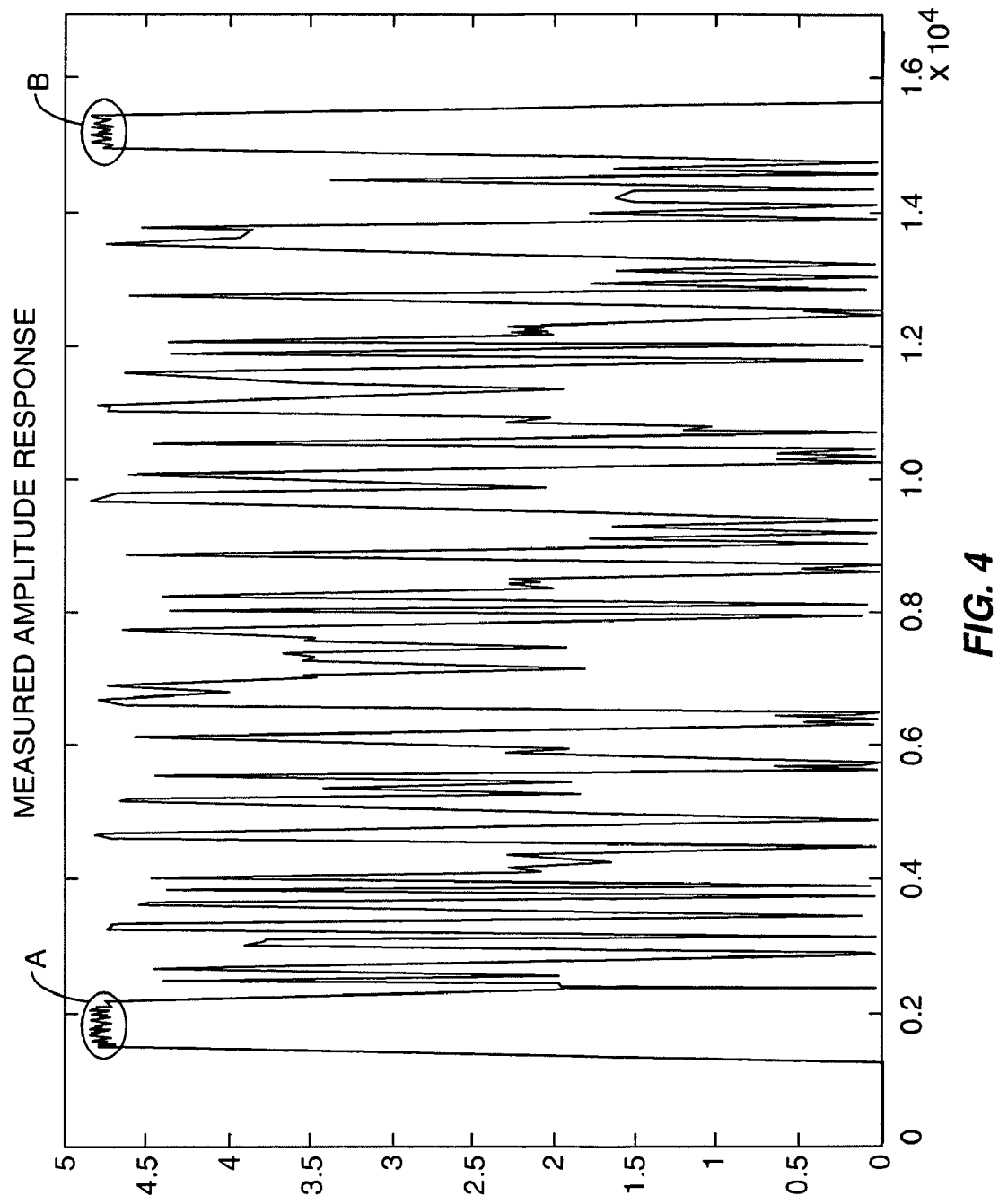
Figure 5:
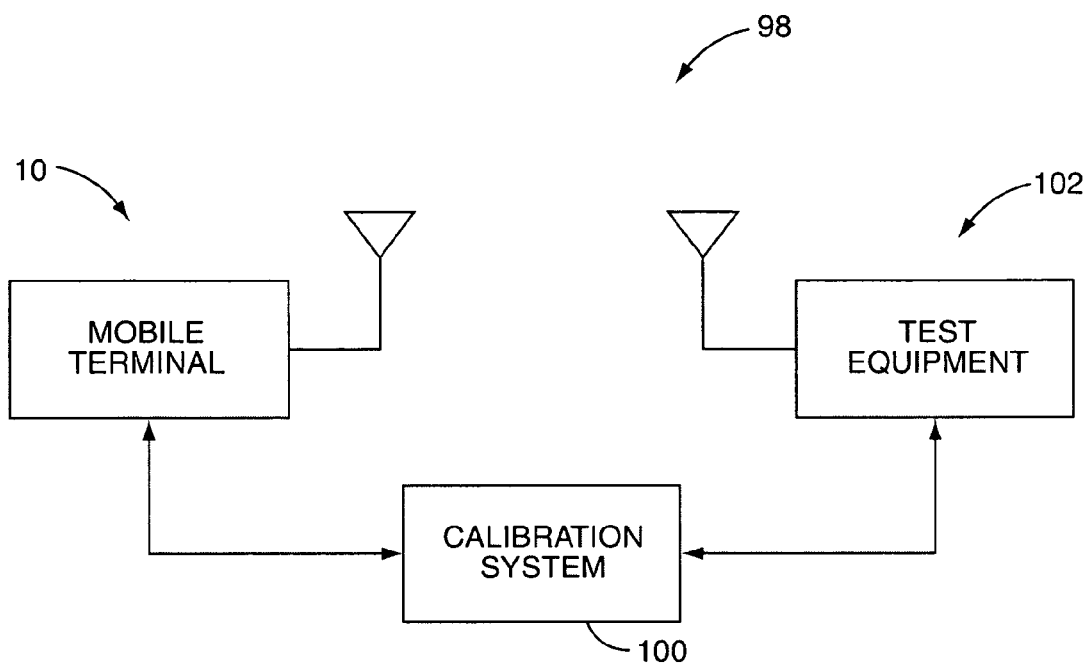

FIG. 4 is a graphical illustration of an exemplary transmit burst used to estimate a frequency error between the radio frequency transmitter section of the mobile terminal and test equipment used to measure the AM/PM distortion of the radio frequency transmitter section; and FIG. 5 illustrates an exemplary system for calibrating the AM/PM pre-distortion of the radio frequency transmitter section of FIG. 2 according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and Will recognize applications of these concepts not particularly addressed herein. It should be understood that these concepts and applications fall within the scope of the disclosure and the accompanying claims.

The present invention provides a system and method for calibrating Amplitude Modulation to Phase Modulation (AM/PM) pre-distortion in a transmitter operating according to a polar modulation scheme. The polar modulation scheme may provide amplitude and phase modulation according to a modulation scheme such as, but not limited to, the Enhanced Data Rates for GSM Evolution (EDGE) modulation scheme of the Global System for Mobile Communications (GSM) standard or the Wideband Code Division Multiple Access (WCDMA) modulation scheme of the Third-Generation for Mobile Telephone Technology (3G) standard.

In general, phase modulation is disabled during transmission of an actual polar modulation signal. As a result, the transmitter provides a radio frequency (RF) output signal having an amplitude modulation component and, ideally, a constant phase. However, the AM/PM distortion of the transmitter creates a phase modulation component in the RF output signal. The phase component of the RF output signal, which is the AM/PM distortion of the transmitter, is measured by test equipment. The AM/PM pre-distortion applied by the transmitter is then calibrated based on the measured AM/PM distortion such that the AM/PM distortion of the transmitter is substantially reduced.

Figure 1:
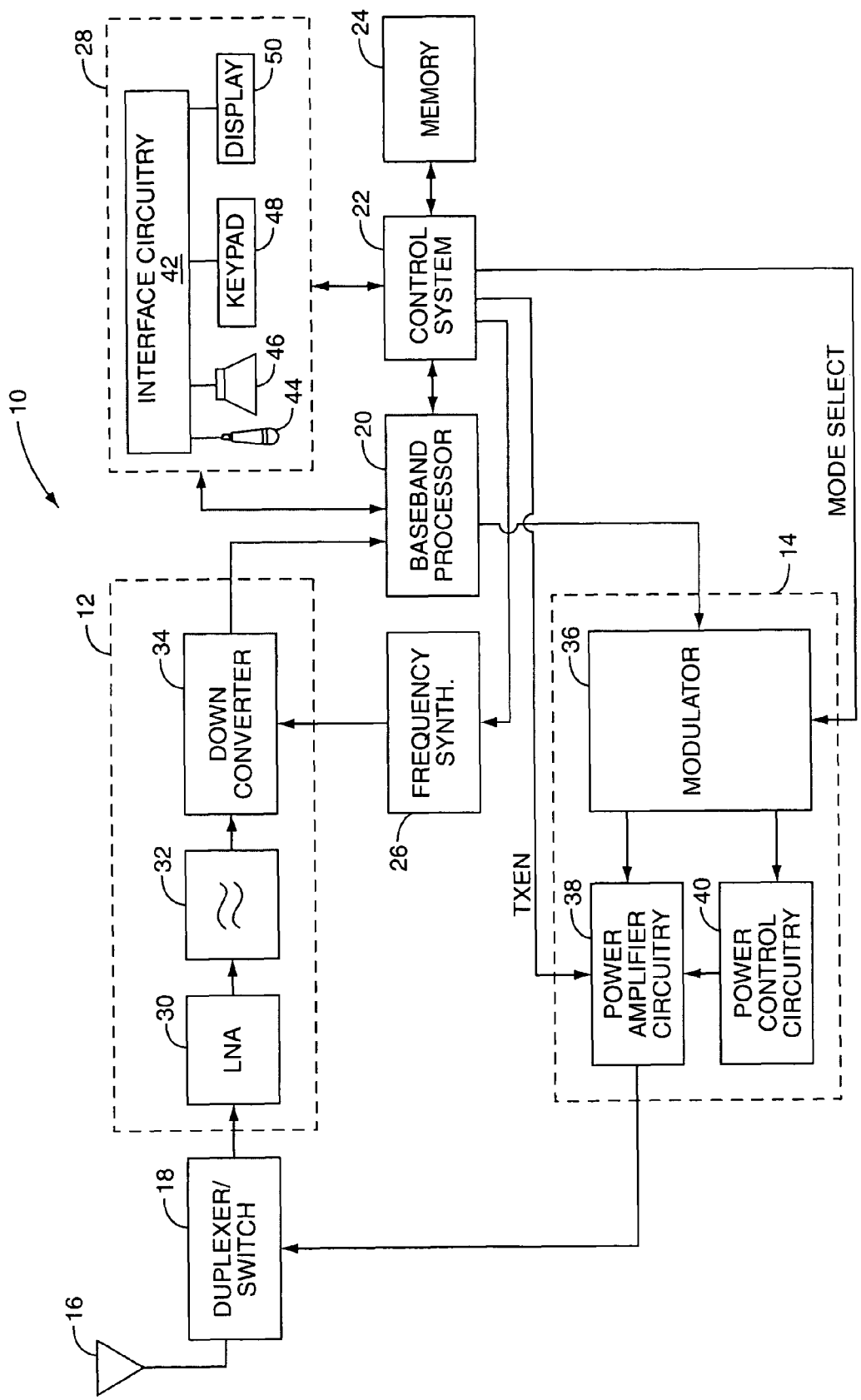
FIG. 1 illustrates an exemplary mobile terminal including a radio frequency transmitter section operating according to a polar modulation scheme according to one embodiment of the present invention.

The present invention is preferably incorporated in a mobile terminal 10, such as a mobile telephone, personal digital assistant, wireless Local Area Network (LAN) device, a base station in a mobile network, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the radio frequency transmitter section 14. A modulator 36 receives the data from the baseband processor 20 and operates according to one or more modulation schemes to provide a modulated signal to the power amplifier circuitry 38. The modulation scheme of the modulator 36 is controlled by a mode select signal (MODE SELECT) from the control system 22.

In one embodiment, the modulator 36 operates according to the GSM standard. However, it should be noted that the present invention is not limited thereto. The present invention is equally applicable to any transmitter operating according to a polar modulation scheme. In this embodiment, the modulator 36 may operate according to either an 8-Level Phase Shift Keying (8PSK) modulation scheme, which is a modulation scheme containing both amplitude and phase components, or a Gaussian Minimum Shift Keying (GMSK) modulation scheme, which is a constant amplitude modulation scheme. When in 8PSK mode, the modulator 36 provides a phase modulation component at a desired transmit frequency to the power amplifier circuitry 38 and an amplitude modulation component to the power control circuitry 40. The power control circuitry 40 controls an output power of the power amplifier circuitry 38 based on the amplitude modulation component or, optionally, a combination of a ramping signal and the amplitude modulation component, thereby providing amplitude modulation of the phase modulation component. When in GMSK mode, the modulator provides a phase modulated signal to the power amplifier circuitry 38 and the ramping signal to the power control circuitry 40, where the power control circuitry 40 controls the output power of the power amplifier circuitry 38 based on the ramping signal.

The power amplifier circuitry 38 amplifies the modulated signal from the modulator 36 to a level appropriate for transmission from the antenna 16. A gain of the power amplifier circuitry 38 is controlled by the power control circuitry 40. In essence, the power control circuitry 40 operates to control a supply voltage provided to the power amplifier circuitry 38. When in 8PSK mode, the power control circuitry 40 controls the supply voltage based on the amplitude modulation component or, optionally, a combination of the amplitude modulation component and the ramping signal from the modulator 36. When in GMSK mode, the power control circuitry 40 operates to control the supply voltage provided to the power amplifier circuitry 38 based on the ramping signal.

A user may interact with the mobile terminal 10 via the interface 28, which may include interface circuitry 42 associated with a microphone 44, a speaker 46, a keypad 48, and a display 50. The interface circuitry 42 typically includes analog-to-digital converters, digital-to-analog converters, amplifiers, and the like. Additionally, it may include a voice encoder/decoder, in which case it may communicate directly with the baseband processor 20.

The microphone 44 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 46 by the interface circuitry 42. The keypad 48 and display 50 enable the user to interact with the mobile terminal 10, input numbers to be dialed and address book information, or the like, as well as monitor call progress information.

FIG. 2 illustrates an exemplary embodiment of the modulator 36 wherein the modulator 36 operates in either an 8PSK mode or GMSK mode. It should be noted 8PSK and GMSK are exemplary modulation schemes and are not intended to limit the scope of present invention. As illustrated, the modulator 36 includes several components, including a data interface 52, a mapping module 54, first and second filters 56, 58, and a polar converter 60. Other components of the modulator 36 will be discussed below. It should be noted that the data interface 52 may include First In First Out (FIFO) circuitry or may alternatively be a real time serial data interface.

The mapping module 54, the filters 56 and 58, and the polar converter 60 form part of an 8PSK modulator. As discussed below, the 8PSK modulator also includes amplitude modulation to phase modulation (AM/PM) compensation circuitry 62, amplitude modulation to amplitude modulation (AM/AM) compensation circuitry 64, and various other components.

When in 8PSK mode, the data interface 52 receives data from the baseband processor 20 (FIG. 1) at the bit rate of the system. This data is passed to the mapping module 54, where the data is grouped into symbols of three consecutive data bits, Grey coded, and rotated by $3\pi/8$ on each symbol as per European Telecommunications Standards Institute (ETSI) specifications. The resulting symbol is mapped to one of sixteen points in an in-phase (I), quadrature phase (Q) constellation.

Both the in-phase (I) and the quadrature phase (Q) components for each point are then filtered by the first and second filters 56, 58, respectively. In an exemplary embodiment, the first and second filters 56, 58 are EDGE finite impulse response (FIR) filters. This, as dictated by the ETSI specifications, shapes the response between symbol times.

After filtering, both the in-phase (I) and the quadrature phase (Q) components are sent to the polar converter 60. The polar converter 60 uses a classical coordinate rotation digital computer (CORDIC) algorithm or like rectangular to polar conversion technique. Thus, the polar converter 60 generates phase ($\phi$) and amplitude (r) equivalent signals. Further information about CORDIC algorithms may be found in *Proceedings of the 1998 ACM/SIGDA Sixth International Symposium On Field Programmable Gate Arrays* by Ray Andraka, Feb. 22-24, pp. 191-200 and "The CORDIC Trigonometric Computing Technique" by Jack E. Volder, *IRE Trans on Elect. Computers*, p. 330, 1959, both of which are hereby incorporated by reference in their entireties.

The amplitude signal (r) is split and directed to the AM/PM compensation circuitry 62, the AM/AM compensation circuitry 64, and summation circuitry 66. The AM/PM compensation circuitry 62 introduces a compensation term to the phase signal ($\phi$) via subtraction circuitry 68 that, after further processing, counteracts the distortion introduced by AM to PM conversion in the power amplifier circuitry 38. For example, the AM/PM compensation circuitry 62 may operate to pre-distort the phase signal ($\phi$) according to a third order pre-distortion polynomial:

$$\phi'(t) = \phi(t) - (CUP \cdot r^3(t) + SQP \cdot r^2(t) + LNP \cdot r(t)),$$

where $\phi'(t)$ is the pre-distorted phase signal, r(t) is the amplitude signal, and CUP, SQP, and LNP are coefficients determined by the calibration process of the present invention. Note that it may be desirable for the radio frequency transmitter section 14 to transmit in a number of frequency bands, which may each be divided into a number of sub-bands. For example, for a GSM transmitter, there are four frequency bands: (1) the GSM 850 frequency band; (2) the GSM 900 frequency band; (3) the GSM 1800 frequency band; and (4) the GSM 1900 frequency band. Each of these frequency bands may be divided into three sub-bands. As discussed below, the calibration process of the present invention may be repeated for each sub-band in each frequency band, thereby providing the coefficients for the pre-distortion polynomial for each frequency band and sub-band combination.

It should be noted that the calibration process of the present invention is not limited to third order polynomial pre-distortion. The present invention is equally applicable to any type of AM/PM pre-distortion in a transmitter operating according to a polar modulation scheme. For example, the AM/PM compensation circuitry 62 may operate based on an Nth order polynomial, where N is any positive integer. The AM/PM compensation circuitry 62 may be implemented to calculate the pre-distorted phase signal ($\phi'$) based on the coefficients defining the pre-distortion polynomial. Alternatively, the AM/PM compensation circuitry 62 may be implemented as a look-up table. As another example, the AM/PM compensation circuitry 62 may include a filter following polynomial pre-distortion or a look-up table providing pre-distortion in order to provide memory effect AM/PM pre-distortion.

The AM/AM compensation circuitry 64 introduces a compensation term to the amplitude signal (r) via the summation circuitry 66 that, after further processing, counteracts the distortion introduced by AM to AM conversion in the power amplifier circuitry 38. As with the AM/PM compensation circuitry 62, the AM/AM compensation circuitry 64 may operate to pre-distort the amplitude signal (r) based on a polynomial defining the desired pre-distortion. Coefficients for the polynomial defining the desired pre-distortion for the amplitude signal (r) may be determined by an associated calibration procedure.

Further details of exemplary embodiments of the AM/PM compensation circuitry 62 and the AM/AM compensation circuitry 64 can be found in commonly owned and assigned U.S. Patent Application Publication No. 2003/0215025, entitled AM TO PM CORRECTION SYSTEM FOR POLAR MODULATOR, filed May 16, 2002; U.S. Patent Application Publication No. 2003/0215026, entitled AM TO AM CORRECTION SYSTEM FOR POLAR MODULATOR, filed May 16, 2002; and U.S. patent application Ser. No. 10/874,509, entitled MULTIPLE POLYNOMIAL DIGITAL PRE-DISTORTION, filed Jun. 23, 2004, which are hereby incorporated by reference in their entireties.

The output of the subtraction circuitry 68, which is referred to herein as a combined signal, is directed to a phase to frequency converter 70. The output of the phase to frequency converter 70 is a frequency signal (f1), which generally corresponds to the desired frequency deviation of the modulated signal. The frequency signal (f1) is provided to a multiplexer switch 72, which is controlled by the mode select signal (MODE SELECT). When in the 8PSK mode, the mode select signal is provided such that the multiplexer switch 72 outputs the frequency signal (f1) from the phase to frequency converter 70. Magnitude adjusters 74, 76 then adjust the magnitude of the amplitude signal (r) and the frequency signal (f1), respectively, to a level expected by a time aligner 78, such that they comply with the appropriate standard. Next, a relative time delay is applied as necessary to the signals for best Error Vector Magnitude (EVM) and spectrum by the time aligner 78, such that the time aligner 78 provides the amplitude signal (r) and a frequency signal (f). The frequency signal (f) is a magnitude adjusted, time aligned version of the output of the multiplexer switch 72. Because these are preferably digital components, concerns about variations in analog components and the corresponding variation in time delays downstream are minimized.

At this point, the amplitude signal (r) and the frequency signal (f) separate and proceed by different paths, an amplitude signal processing path and a frequency signal processing path, to the power amplifier circuitry 38. With respect to the amplitude signal processing path, when in the 8PSK mode, the amplitude signal (r) is provided to a multiplier 80 via a switch 82, which is controlled by the mode select signal (MODE SELECT). A power amplifier (PA) ramp generator 84 generates a ramping signal ($V_{RAMP}$) and provides the ramping signal ($V_{RAMP}$) to the multiplier 80. The magnitude of the ramping signal ($V_{RAMP}$) is controlled by a power amplifier gain setting (PAG). The multiplier 80 operates to multiply the pre-distorted amplitude signal (r') and the ramping signal ($V_{RAMP}$) to provide a digital power control signal. A summation node 86 may add an offset to the digital power control signal, where the output of the summation node 86 is converted to an analog power control signal by a digital-to-analog (D/A) converter 88. The analog power control signal is used by the power control circuitry 40 to set the supply voltage on the power amplifier circuitry 38. As the amplitude signal (r) changes, the supply voltage provided to the power amplifier circuitry 38 changes, and the output power will vary as $V^2/R_{out}$ ($R_{out}$ is not shown, but is effectively the load on the power amplifier circuitry 38). This is sometimes known as "plate modulation."

The frequency signal (f) from the time aligner 78 is directed to a digital filter 90 and a digital pre-distortion filter 92 to provide a pre-distorted frequency signal (f') to a fractional-N divider in either a reference path or a feedback path of a phase locked loop (PLL) 94. The pre-distorted frequency signal (f'), which is a digital signal, is provided to the PLL 94 to provide direct digital modulation in a manner similar to that described in commonly owned and assigned U.S. Pat. No. 6,834,084, entitled DIRECT DIGITAL POLAR MODULATOR, issued Dec. 21, 2004, which is hereby incorporated herein by reference in its entirety. The PLL 94 generates an output at the desired radio frequency. In one embodiment, the data interface 52 provides a digital data interface to the baseband processor 20, and the entire phase path from the data interface 52 to the PLL 94 is a digital path.

The modulator 36 also includes a GMSK modulator, which includes the GMSK modulation circuitry 96. When in GMSK mode, the GMSK modulation circuitry 96 processes the data to generate a frequency signal (f2). In one embodiment, the GMSK modulation circuitry 96 is a look-up table. Another exemplary embodiment of the GMSK modulation circuitry 96 is discussed in U.S. Pat. No. 5,825,257, entitled GMSK MODULATOR FORMED OF PLL TO WHICH CONTINUOUS PHASE MODULATED SIGNAL IS APPLIED, issued Oct. 20, 1998, which is hereby incorporated by reference in its entirety. It should be appreciated that other embodiments of the GMSK modulation circuitry 96 may also be used and the particular circuitry is not central to the present invention.

The output of the GMSK modulation circuitry 96, which is the frequency signal (f2), is provided to the multiplexer switch 72. In GMSK mode, the multiplexer switch 72 outputs the frequency signal (f2) from the GMSK modulation circuitry 96. As discussed above, magnitude adjusters 74, 76 then adjust the magnitude of the amplitude signal (r) and the frequency signal (f2), respectively, to a level expected by the time aligner 78, such that they comply with the appropriate standard. Next, a relative time delay is applied as necessary to the signals for best Error Vector Magnitude (EVM) and spectrum by the time aligner 78.

At this point, the amplitude signal (r) and the frequency signal (f) output by the time aligner 78 separate and proceed by different paths to the power amplifier circuitry 38. With respect to the amplitude signal processing path, when in the GMSK mode, the switch 82 is controlled such that a unity signal is provided to the multiplier 80. Accordingly, the multiplier 80 multiplies the ramping signal ($V_{RAMP}$) from the PA ramp generator 84 by 1 to provide the digital power control signal. An offset may be applied to the digital power control signal by the summation node 86, and the output of the summation node 86 is converted to the analog power control signal by the digital-to-analog converter 88. The analog power control signal is used by the power control circuitry 40 to set the collector voltage on the power amplifier circuitry 38.

As in 8PSK mode, when in GMSK mode, the frequency signal (f) from the time aligner 78 is directed to the digital filter 90, the digital pre-distortion filter 92, and the PLL 94. Based on the pre-distorted frequency signal (f') from the pre-distortion filter 92, the PLL 94 generates the output at the desired radio frequency.

Figure 3:
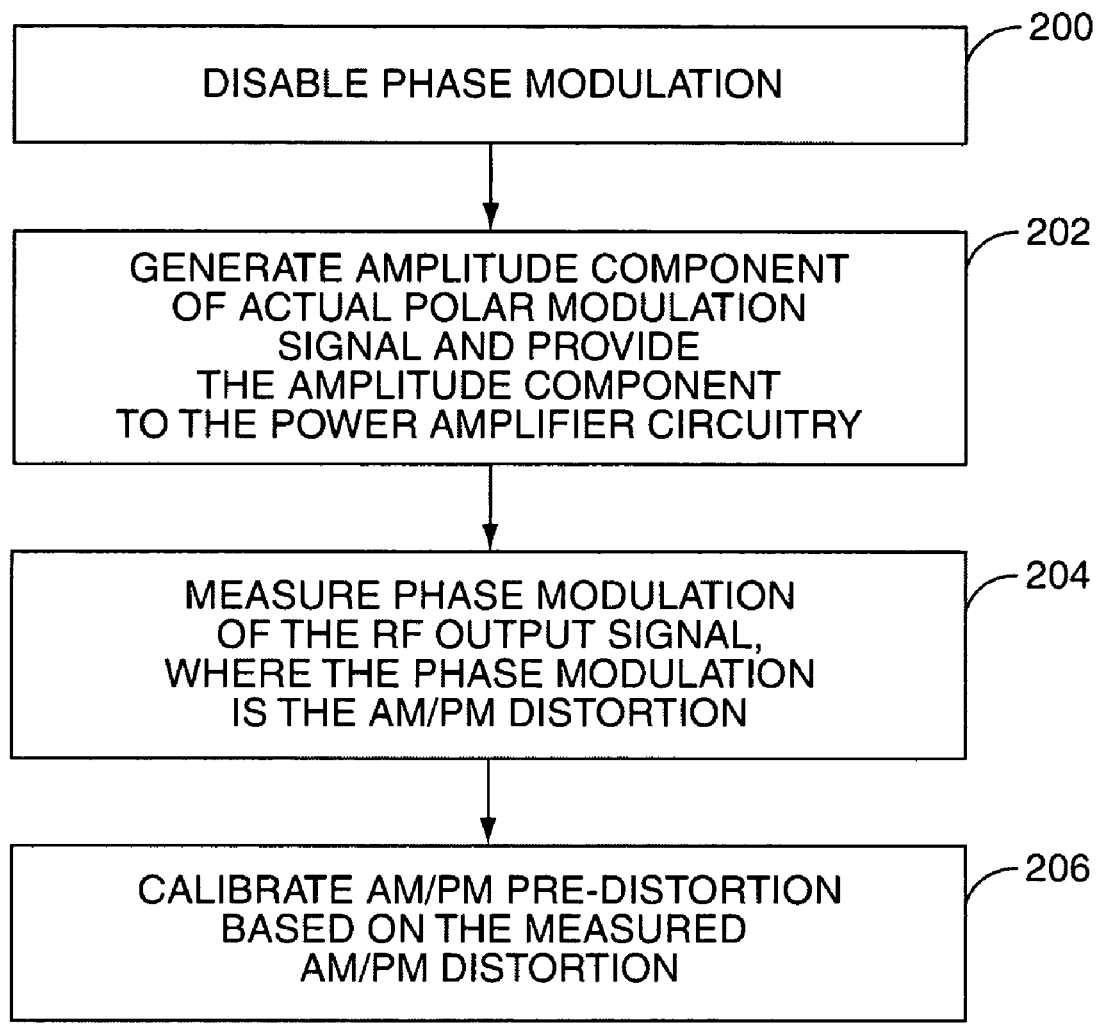
FIG. 3 illustrates a process for calibrating the AM/PM pre-distortion applied by the radio frequency transmitter section of FIG. 2 according to one embodiment of the present invention.

FIG. 3 illustrates an exemplary process for calibrating the AM/PM compensation circuitry 62 of FIG. 2 according to one embodiment of the present invention. First, phase modulation is disabled (step 200). The phase modulation may be disabled by, for example, setting a phase gain setting (PGAIN) provided to the magnitude adjuster 76 to zero. As such, the output of the magnitude adjuster 76 is zero, thereby disabling the phase modulation. Other means for disabling the phase modulation will be apparent to one of ordinary skill in the art upon reading this disclosure. In general, phase modulation may be disabled by any means that sets the input of the PLL 94 to a constant value. For example, a switch may be used to connect the input of the PLL 94 to a constant voltage, such as ground, rather than to the output of the pre-distortion filter 92. As another example, the phase output of the polar converter 60 may be disabled such that the phase signal (ϕ) is zero or constant.

An amplitude component of an actual polar modulation signal is then generated and provided to the power amplifier circuitry 38 (step 202). For example, the amplitude component may be the amplitude component of an actual 8PSK signal generated according to the EDGE modulation scheme. By using the amplitude component of an actual polar modulation signal, all amplitude dependent phase errors are captured such that the resultant AM/PM distortion of the output of the radio frequency transmitter section 14 accurately represents the AM/PM distortion of the radio frequency transmitter section 14 during operation according to the desired communications standard.

More specifically, in this example, the modulator 36 is set to EDGE mode and data, which may be known, is provided to the to the data interface 52. As a result, the amplitude signal (r) is generated at the output of the polar converter 60. Note that the amplitude signal (r) provided by the polar converter 60 is preferably known for the calibration process, as discussed below. In this embodiment, the amplitude signal (r) is the amplitude component of an actual EDGE signal. The amplitude signal (r) from the polar converter 60 is then processed and provided to the power control circuitry 40 to control the supply voltage provided to the power amplifier circuitry 38. Since phase modulation is disabled, the input of the PLL 94 is constant such that the output of the PLL 94 is a signal at the desired radio frequency having no phase modulation component. However, note that the output of the PLL 94 may have a phase error, as discussed below.

The power amplifier circuitry 38 amplifies the output of the PLL 94 to provide a radio frequency (RF) output signal. Ideally, the RF output signal is a signal at the desired radio frequency having an actual EDGE amplitude modulation component and a constant phase. However, due to the AM/PM distortion of the radio frequency transmitter section 14, the RF output signal includes a phase modulation component, which is the AM/PM distortion. The AM/PM distortion is largely due to the AM/PM distortion of the power amplifier circuitry 38. In addition, the AM/PM distortion may include phase errors associated with the PLL 94 and the input impedance of the power amplifier circuitry 38, which is a function of the supply voltage provided to the power amplifier circuitry 38. These additional phase errors may include push and pull effects on a reference oscillator used by the PLL 94, PLL sideband noise, PLL remodulation due to reverse amplitude modulation, and a phase error due to variations in the input impedance of the power amplifier circuitry 38.

The RF output signal is downconverted and sampled by test equipment to measure the phase modulation of the RF output signal, where the phase modulation of the RF output signal is the AM/PM distortion of the radio frequency transmitter section 14 (step 204). As will be apparent to one of ordinary skill in the art, test equipment such as that manufactured and sold by Agilent and Rhode and Schwartz may be used to directly measure the phase modulation of the RF output signal. Since the phase modulation component of the RF output signal should ideally be zero, the phase modulation measured by the test equipment is the AM/PM distortion of the radio frequency transmitter section 14. Importantly, since the phase modulation component is disabled, the need for synchronizing and subtracting an ideal phase modulation component from the RF output signal in order to determine the AM/PM distortion is avoided. As a result, the processing time required to determine the AM/PM distortion, and thus to perform the calibration process, is substantially reduced.

Once the AM/PM distortion of the radio frequency transmitter section 14 is measured, the AM/PM pre-distortion is calibrated based on the measured AM/PM distortion (step 206). In essence, the AM/PM distortion is calibrated such that the pre-distortion applied to the phase signal ($\phi$) provided by the polar converter 60 substantially cancels the AM/PM distortion of the radio frequency transmitter section 14.

As an example, the RF output signal (RFout) at the output of the radio frequency transmitter section 14 may be defined as:

$$RFout = A_{MEASURED}(t) \cdot \cos(2 \cdot \pi f_{RF} \cdot t + 2 \cdot \pi f_{ERROR} \cdot t + \text{PhaseError}(t)),$$

where $A_{MEASURED}$ is the measured amplitude modulation component, $f_{RF}$ is the carrier frequency, $f_{ERROR}$ is a frequency error between test equipment and the radio frequency transmitter section 14, and PhaseError is the AM/PM distortion measured by the test equipment. The frequency error $f_{ERROR}$ may be automatically corrected by the test equipment or removed using a linear phase estimation and subtraction, as discussed below.

In order to calibrate the AM/PM pre-distortion, a corrected phase error (CorrectedPhaseError) may be defined as:

$$\text{CorrectedPhaseError}(t) = \text{PhaseError}(t) - \text{Compensation}(t),$$

where Compensation is the AM/PM compensation, or pre-distortion, applied by the AM/PM compensation circuitry 62 and r(t) is the ideal amplitude signal provided by the polar converter 60.

As an example, the AM/PM compensation may be defined as:

$$\text{Compensation}(t) = CUP \cdot r^3(t-t_D) + SQP \cdot r^2(t-t_D) + LNP \cdot r(t-t_D),$$

where CUP, SQP, and LNP are coefficients defining the desired pre-distortion. Thus, $$\text{CorrectedPhaseError}(t) = \text{PhaseError}(t) - \{CUP \cdot r^3(t-t_D) + SQP \cdot r^2(t-t_D) + LNP \cdot r(t-t_D)\}$$

where $t_D$ is a time delay that, in this example, is equal to the time delay between the output of the polar converter 60 and the output of the radio frequency transmitter section 14. The time delay $t_D$ is used to essentially time align the amplitude signal (r) output by the polar converter 60 and the measured amplitude modulation component ($A_{MEASURED}$) at the output of the radio frequency transmitter section 14. Since the amplitude modulation component is known, the time delay $t_D$ may be determined by measuring or determining the delay from when a peak or minimum in the amplitude signal (r) occurs and when the peak or minimum occurs in the measured amplitude modulation component ($A_{MEASURED}$). Note that this delay estimation may be averaged over several peak or minimum occurrences in order to remove amplitude noise. Alternatively, the amplitude noise may be removed by filtering.

Once the time delay $t_D$ has been estimated, the coefficients (CUP, SQP, and LNP) may be optimized by minimizing the corrected phase error (CorrectedPhaseError) based on RMS error minimization or polyfitting the AM/PM compensation to the inverse of the measured AM/PM distortion, as will be apparent to one of ordinary skill in the art.

The calibration process may be repeated to calibrate the AM/PM compensation circuitry 62 for each of a number of sub-bands in each of a number of frequency bands. In addition, it may be desirable to calibrate the AM/PM compensation circuitry 62 for each of a number of power control levels (PCLs). Thus, the process may be repeated a number of times for each sub-band and frequency band combination in order to calibrate the AM/PM compensation circuitry 62 for each PCL.

In one embodiment, the present invention substantially reduces the number of calibrations required for the AM/PM compensation circuitry 62 by increasing the dynamic range of the actual amplitude modulation component used for the calibration process. For example, an EDGE amplitude modulation component has a 17 dB dynamic range. However, for EDGE operation, the total dynamic range for the power amplifier circuitry 38 may be 44 dB (30 dB of dynamic range for the PCLs and 14 dB of RMS to minimum). Thus, three calibrations may be required to cover the desired 44 dB range (44 dB/17 dB=2.6) for each desired frequency band and sub-band combination.

In order to cover more of the desired dynamic range for the power amplifier circuitry 38 with each calibration, the offset and gain of the actual amplitude modulation component may be adjusted to increase the dynamic range of the actual amplitude modulation component. For example, the power amplifier gain setting (PAG) may be set to a maximum value and the offset setting (OFFSET) may be set to a minimum value in order to increase the dynamic range of the actual amplitude modulation component applied to the power amplifier circuitry 38 via the power control circuitry 40 to a maximum. As a result, the dynamic range of an actual EDGE amplitude modulation component may, for example, be increased from 17 dB to 25 dB such that only two calibrations, rather than three, are performed for each sub-band and frequency band combination.

FIG. 4 illustrates an exemplary transmit burst used to determine the frequency error ($f_{ERROR}$) between the radio frequency transmitter section 14 and the test equipment used to measure the AM/PM distortion of the radio frequency transmitter section 14 in the manner described above. In this example, the illustrated transmit burst is provided according to the EDGE modulation scheme. In general, the known data for the transmit burst is provided such that there are two segments (A, B) of the transmit burst wherein the amplitude modulation component of the RF output signal is minimal. For example, according to the EDGE modulation scheme, the data pattern may be provided such that the symbols in the two segments (A, B) are all zeros such that there is ideally a constant phase rotation with no amplitude variation. Alternatively, according to the EDGE modulation scheme, the data pattern may be 0101 . . . such that there is minimal amplitude variation in the two segments (A, B) of the transmit burst.

By ensuring that there is minimal amplitude variation during the two segments (A, B) of the transmit burst, the AM/PM distortion during the two segments (A, B) of the transmit burst is also minimized. As a result, the frequency error ($f_{ERROR}$) can be distinguished from the AM/PM distortion.

It should be noted that in this example, the two segments (A, B) are at the beginning and end of the transmit burst. However, the present invention is not limited thereto. The two segments may be at any location during the transmit burst as long as the time between the two segments (A, B) is sufficiently long to provide the desired accuracy for the frequency error ($f_{ERROR}$). In addition, the two segments (A, B) may be in separate transmit bursts.

In order to compute the frequency error ($f_{ERROR}$), measurements of the phase component of the RF output signal are obtained by the test equipment for each of the two segments (A, B). The measurements of the phase component for the first segment (A) are averaged to provide a first average phase value. Likewise, the measurements of the phase component for the second segment (B) are averaged to provide a second average phase value. Since frequency is equal to change in phase over change in time, the frequency error may then be computed based on the equation:

$$f_{ERROR} = \frac{\phi_{B,AVG} - \phi_{A,AVG}}{\Delta t},$$

where $\phi_{A,AVG}$ is the first average phase value for the first segment (A), $\phi_{B,AVG}$ is the second average phase value for the second segment (B), and $\Delta t$ is a time period equal to a difference in time between a point during the second segment (B) and a point during the first segment (A). As an example, $\Delta t$ may be equal to a difference in time between a midpoint of the second segment (B) and a midpoint of the first segment (A). In one embodiment, the time period $\Delta t$ may be computed based on a sampling rate of the test equipment and a known number of samples between the desired points in the two segments (A, B).

FIG. 5 illustrates an exemplary system 98 for performing the calibration process of the present invention. In general, the system 98 includes the mobile terminal 10, a calibration system 100, and test equipment 102. In operation, the calibration system 100 communicates with the mobile terminal 10 to initiate the calibration process. In response, the mobile terminal 10 disables the phase modulation and transmits the RF output signal. The test equipment 102 measures the phase modulation component of the RF output signal, which is the AM/PM distortion of the mobile terminal 10. The test equipment 102 provides the measurements of the AM/PM distortion to the calibration system 100, and the calibration system 100 calibrates the AM/PM pre-distortion of the mobile terminal 10 based on the measurements of the AM/PM distortion. For example, the calibration system 100 may calculate coefficients for a polynomial defining the AM/PM pre-distortion applied by the mobile terminal 10, calculate values for a look-up table used to provide AM/PM pre-distortion, or the like.

The present invention provides substantial opportunity for variation without departing from the spirit or scope of the present invention. For example, while the discussion of the calibration process above focuses mainly on a radio frequency transmitter section 14 and associated modulator 36 operating according to the EDGE modulation scheme of the GSM standard, the present invention is equally applicable to any polar modulation scheme. Additionally, while examples of polynomial AM/PM pre-distortion are given above, the present invention is not limited thereto. The present invention may be used to calibrate any means for providing AM/PM compensation in a polar transmitter.

Those skilled in the art will recognize improvements and modifications to the preferred embodiments of the present invention. All such improvements and modifications are considered within the scope of the concepts disclosed herein and the claims that follow.

What is claimed is:

1. A method of calibrating Amplitude Modulation to Phase Modulation (AM/PM) compensation in a transmitter operating according to a polar modulation scheme comprising:
   disabling phase modulation of the transmitter;
   transmitting a radio frequency output signal comprising an amplitude modulation component and a phase modulation component, wherein due to disabling the phase modulation of the transmitter the phase modulation component corresponds to an AM/PM distortion of the transmitter;
   measuring the phase modulation component of the radio frequency output signal to obtain measurements of the AM/PM distortion of the transmitter; and calibrating the AM/PM compensation applied by the transmitter based on the measurements of the AM/PM distortion.

2. The method of claim 1 wherein transmitting the radio frequency output signal comprises generating the amplitude modulation component according to a desired modulation scheme.

3. The method of claim 2 wherein the desired modulation scheme is the Enhanced Data Rates for GSM Evolution (EDGE) modulation scheme of the Global System for Mobile Communications (GSM) standard.

4. The method of claim 2 wherein generating the amplitude modulation component further comprises increasing a dynamic range of the amplitude modulation component.

5. The method of claim 4 wherein increasing the dynamic range comprises decreasing an offset and increasing a gain of the amplitude modulation component, thereby increasing the dynamic range of the amplitude modulation component.

6. The method of claim 4 wherein the desired modulation scheme is the Enhanced Data Rates for GSM Evolution (EDGE) modulation scheme of the Global System for Mobile Communications (GSM) standard and increasing the dynamic range comprises increasing the dynamic range of the amplitude modulation component such that the dynamic range is greater than 17 dB.

7. The method of claim 1 wherein the steps of disabling, transmitting, measuring, and calibrating are performed for each of a plurality of sub-bands in each of a plurality of frequency bands.

8. The method of claim 1 wherein measuring the phase modulation component of the radio frequency output signal to obtain measurements of the AM/PM distortion of the transmitter comprises:
  measuring the phase modulation component of the radio frequency output signal to provide measurements of the phase modulation component;
  determining a frequency error between the transmitter and test equipment measuring the phase modulation component; and
  removing the frequency error from the measurements of the phase modulation component to provide the measurements of the AM/PM distortion of the transmitter.

9. The method of claim 8 wherein transmitting the radio frequency output signal comprises transmitting the radio frequency output signal such that the amplitude component is minimized during first and second segments of the radio frequency output signal, and determining the frequency error comprises:
  determining a first average phase value for the first segment of the radio frequency output signal based on corresponding ones of the measurements of the phase modulation component;
  determining a second average phase value for the second segment of the radio frequency output signal based on corresponding ones of the measurements of the phase modulation component; and
  determining the frequency error based on a difference of the first and second average phase values and a known time between a first point during the first segment of the radio frequency output signal and a second point during the second segment of the radio frequency output signal.

10. A system for calibrating Amplitude Modulation to Phase Modulation (AM/PM) compensation in a transmitter operating according to a polar modulation scheme comprising:
  a) a transmitter operating according to a polar modulation scheme and adapted to disable phase modulation during calibration to provide a radio frequency output signal including an amplitude modulation component and a phase modulation component corresponding to an AM/PM distortion of the transmitter due to disabling the phase modulation; and
  b) a calibration control system adapted to:
    i) receive measurements of the phase modulation component of the radio frequency output signal, wherein the measurements of the phase modulation component correspond to measurements of the AM/PM distortion of the transmitter; and
    ii) calibrate AM/PM compensation applied by the transmitter based on the measurements of the AM/PM distortion such that the AM/PM distortion of the transmitter is substantially reduced.

11. The system of claim 10 wherein the transmitter is further adapted to generate the amplitude modulation component according to a desired modulation scheme.

12. The system of claim 11 wherein the desired modulation scheme is the Enhanced Data Rates for GSM Evolution (EDGE) modulation scheme of the Global System for Mobile Communications (GSM) standard.

13. The system of claim 11 wherein the transmitter is further adapted to increase a dynamic range of the amplitude modulation component.

14. The system of claim 13 wherein the transmitter is further adapted to decrease an offset and increase a gain of the amplitude modulation component in order to increase the dynamic range of the amplitude modulation component.

15. The system of claim 13 wherein the desired modulation scheme is the Enhanced Data Rates for GSM Evolution (EDGE) modulation scheme of the Global System for Mobile Communications (GSM) standard and the transmitter is further adapted to increase the dynamic range of the amplitude modulation component such that the dynamic range is greater than 17 dB.

16. The system of claim 10 wherein the calibration control system is further adapted to:
  determine a frequency error between the transmitter and test equipment providing the measurements of the phase modulation component; and
  remove the frequency error from the measurements of the phase modulation component to provide the measurements of the AM/PM distortion of the transmitter.

17. The system of claim 16 wherein the transmitter is further adapted to transmit the radio frequency output signal such that the amplitude component is minimized during first and second segments of the radio frequency output signal, and the calibration control system is further adapted to:
  determine a first average phase value for the first segment of the radio frequency output signal based on corresponding ones of the measurements of the phase modulation component;
  determine a second average phase value for the second segment of the radio frequency output signal based on corresponding ones of the measurements of the phase modulation component; and
  determine the frequency error based on a difference of the first and second average phase values and a known time between a first point during the first segment of the radio frequency output signal and a second point during the second segment of the radio frequency output signal.

18. A system for calibrating Amplitude Modulation to Phase Modulation (AM/PM) compensation in a transmitter operating according to a polar modulation scheme comprising:
  means for disabling phase modulation of the transmitter;

means for transmitting a radio frequency output signal comprising an amplitude modulation component and a phase modulation component, wherein due to disabling the phase modulation of the transmitter the phase modulation component corresponds to an AM/PM distortion of the transmitter;

means for measuring the phase modulation component of the radio frequency output signal to obtain measurements of the AM/PM distortion of the transmitter; and means for calibrating the AM/PM compensation applied by the transmitter based on the measurements of the AM/PM distortion.

19. The system of claim 18 wherein the means for transmitting the radio frequency output signal comprises a means for generating the amplitude modulation component according to a desired modulation scheme.

20. The system of claim 19 wherein the desired modulation scheme is the Enhanced Data Rates for GSM Evolution (EDGE) modulation scheme of the Global System for Mobile Communications (GSM) standard.

21. The system of claim 19 wherein the means for generating the amplitude modulation component comprises a means for increasing a dynamic range of the amplitude modulation component.

22. The system of claim 21 wherein the means for increasing the dynamic range comprises a means for decreasing an offset of the amplitude modulation component and a means for increasing a gain of the amplitude modulation component, wherein the offset and gain of the amplitude modulation component are adjusted to increase the dynamic range of the amplitude modulation component.

23. The system of claim 21 wherein the desired modulation scheme is the Enhanced Data Rates for GSM Evolution (EDGE) modulation scheme of the Global System for Mobile Communications (GSM) standard and the means for increasing the dynamic range is further adapted to increase the dynamic range of the amplitude modulation component such that the dynamic range is greater than 17 dB.

24. The system of claim 18 wherein the means for disabling, the means for transmitting, the means for measuring, and the means for calibrating are further adapted to calibrate the AM/PM compensation applied by the transmitter for each of a plurality of sub-bands in each of a plurality of frequency bands.

25. The system of claim 18 wherein the means for measuring the phase modulation component of the radio frequency output signal to obtain measurements of the AM/PM distortion of the transmitter is further adapted to:

measure the phase modulation component of the radio frequency output signal to provide measurements of the phase modulation component;

determine a frequency error between the transmitter and test equipment measuring the phase modulation component; and remove the frequency error from the measurements of the phase modulation component to provide the measurements of the AM/PM distortion of the transmitter.

26. The system of claim 25 wherein the means for transmitting the radio frequency output signal is further adapted to transmit the radio frequency output signal such that the amplitude component is minimized during first and second segments of the radio frequency output signal, and the means for determining the frequency error is further adapted to:

determine a first average phase value for the first segment of the radio frequency output signal based on corresponding ones of the measurements of the phase modulation component;

determine a second average phase value for the second segment of the radio frequency output signal based on corresponding ones of the measurements of the phase modulation component; and determine the frequency error based on a difference of the first and second average phase values and a known time between a first point during the first segment of the radio frequency output signal and a second point during the second segment of the radio frequency output signal.

* * * * *